United States Patent [19]
Williams et al.

[11] 4,354,111
[45] Oct. 12, 1982

[54] SCREEN LENS ARRAY SYSTEM

[75] Inventors: Norman Williams, New Hope, Pa.; George R. Koch, Los Altos, Calif.

[73] Assignee: Veeco Instruments Incorporated, Melville, N.Y.

[21] Appl. No.: 242,391

[22] Filed: Mar. 10, 1981

[51] Int. Cl.³ .............................................. H01J 37/00
[52] U.S. Cl. ............................... 250/396 R; 250/492.2
[58] Field of Search .................... 250/492 A, 397, 398, 250/491, 503, 505, 396; 313/360

[56] References Cited

U.S. PATENT DOCUMENTS

| | | | |
|---|---|---|---|
| 3,547,074 | 12/1970 | Hirschfeld | 250/492 A |
| 3,736,425 | 5/1973 | Chernow | 250/492 A |
| 3,946,268 | 3/1976 | Welter . | |
| 3,993,509 | 11/1976 | McGinty | 250/492 A |
| 4,164,658 | 8/1979 | Frosien et al. | 250/397 |
| 4,182,958 | 1/1980 | Goto et al. . | |
| 4,258,265 | 3/1981 | Sumi | 250/492 A |

FOREIGN PATENT DOCUMENTS 1489500  10/1977  United Kingdom ........... 250/492 A

*Primary Examiner*—Bruce C. Anderson
*Attorney, Agent, or Firm*—Morgan, Finnegan, Pine, Foley & Lee

[57] ABSTRACT

A screen lens array system including a lens cover plate or top plate and a screen lens array or bottom plate for use in a parallel charged particle beam exposure system is disclosed. The screen lens array, which comprises a pair of lens plates mutually aligned with respect to one another, breaks up a flood beam of charged particles into a multiplicity of beams in parallel and focuses them onto a substrate target surface.

The charged particle flood beam impinges the smaller apertures, of the upper lens plate, which serve as apertures to control image aberrations. The larger set of apertures, of the lower lens plate, are influenced by the electric field between the screen lens array and the target surface to form the embodiment of most of the lens action.

Mounted above and displaced from the screen lens array is the lens cover plate which also contains an array of apertures.

By imparting a linear, mechanical motion to the top plate, it selectively controls, i.e., masks, the passage of the flood beam through certain, but not all, of the apertures of the bottom plate and, therefore, onto the target surface.

19 Claims, 5 Drawing Figures

SCREEN LENS ARRAY SYSTEM

BACKGROUND OF THE INVENTION

This invention relates to the field of charged particle beam exposure system, and more particularly to a screen lens array for use with a parallel charged particle beam exposure system.

As integrated circuits become more complex there is a general trend in the semiconductor industry toward increasing device packaging density. The present philosophy is to keep chip or die sizes as small as possible, and so increase device yield. However, it is obvious that chip size cannot be arbitrarily reduced because of the inherent resolution limits of presently used photolithographic processes. In particular, the wavelength of light imposes a barrier to the reproduction of detail in the region of one micron.

A number of solutions have been proposed to solve the resolution problem and there is considerable activity in this area presently underway in the semiconductor industry. These solutions are based on lithographic techniques that employ particles of shorter wavelengths than visible light to overcome the resolution limitation. Generally, two classes of short wavelength particles have been proposed as alternatives to light, i.e., high energy photons (x-rays) and electrons.

An optimal lithographic system would have to possess certain attributes in order for it to be a serious contender for use in the production of integrated circuits. These attributes include resolution, coverage, lithographic speed, reregistration and stability.

At present, minimum reproducible line widths of 1 micron are mandatory, and future integrated circuit structures will probably push the desired system resolution requirements to below ¼ micron. The exposure system should be capable of covering the standard 3" and/or 4" wafers presently used in industry and be expandable to cover the larger sized wafers being contemplated. Clearly wafer exposure times measured in tens of minutes to hours are not acceptable in production exposure systems. Acceptable throughput conditions demand full 3" and/or 4" wafer exposure times of at most a few minutes.

A parallel charged particle beam exposure system is described in a commonly assigned copending application of Eugene R. Westerberg and Ivor Brodie, Ser. No. 227,620 filed Jan. 23, 1981, the disclosure of which is incorporated herein by reference. In this system, the throughput capability of conventional types of lithography systems is increased significantly by utilizing a parallel charged particle beam exposure system for directly writing an integrated circuit pattern simultaneously at a plurality of locations on a substrate target surface. In one embodiment of the disclosed system, an electron source produces an electron beam which is used to illuminate an object aperture. A screen lens array consisting of a multiplicity of holes breaks up the flood electron beam emanating from the object aperture into a multiplicity of beams in parallel and focuses them on a resist-coated substrate. Each hole in the screen lens array acts like a small aperture lens when a positive potential is applied to the wafer with respect to the screen lens array.

It should be apparent that the use of a screen lens array system in a system of the type described in the aforementioned application of Westerberg and Brodie presents serious technical obstacles. In particular, a selective means of substrate registration and pattern writing would be required. Moreover, because of the amount of heat imparted to the screen lens array by the impinging flood beam, the individual lenslets could expand beyond acceptable tolerance levels resulting in severe pattern distortion. Also, secondary electrons generated at either plate of the screen lens array could very easily fog the resist on the substrate target surface.

An optimal screen lens array system would have to meet certain stringent performance specifications. In particular, it would have to be capable of selectively opening the individual lenslet apertures, suppressing low energy secondary electrons, and minimizing thermal beam load on the lens array.

It is accordingly a general object of the present invention to overcome the aforementioned obstacles and to fulfill the needs mentioned by providing a screen lens array system for use in a charged particle beam exposure system having all of the desirable attributes noted above.

It is a particular object of the invention to provide a high resolution screen lens array system.

Other objects will be apparent in the following detailed description and practice of the invention.

SUMMARY OF THE INVENTION

The foregoing and other objects and advantages which will be apparent in the following detailed description of the preferred embodiment, or in the practice of the invention, are achieved by the invention disclosed herein, which generally may be characterized as: a screen lens array system comprising: a top plate having a first and second group of apertures therein; a bottom plate having a first and second group of apertures therein; said top plate and said bottom plate being maintained in a predetermined spaced-apart relationship; wherein the first group of apertures in said top and bottom plates are normally aligned and the second group of apertures in said top and bottom plates are normally misaligned; and said top and bottom plates being capable of relative movement therebetween to cause said normally aligned apertures in said top and bottom plates to become misaligned and said normally misaligned apertures in said top and bottom plates to become aligned.

BRIEF DESCRIPTION OF THE DRAWINGS

Serving to illustrate an exemplary embodiment of the invention are the drawings of which.

DETAILED DESCRIPTION OF THE PREFERRED EMBODIMENT

Figure 1:
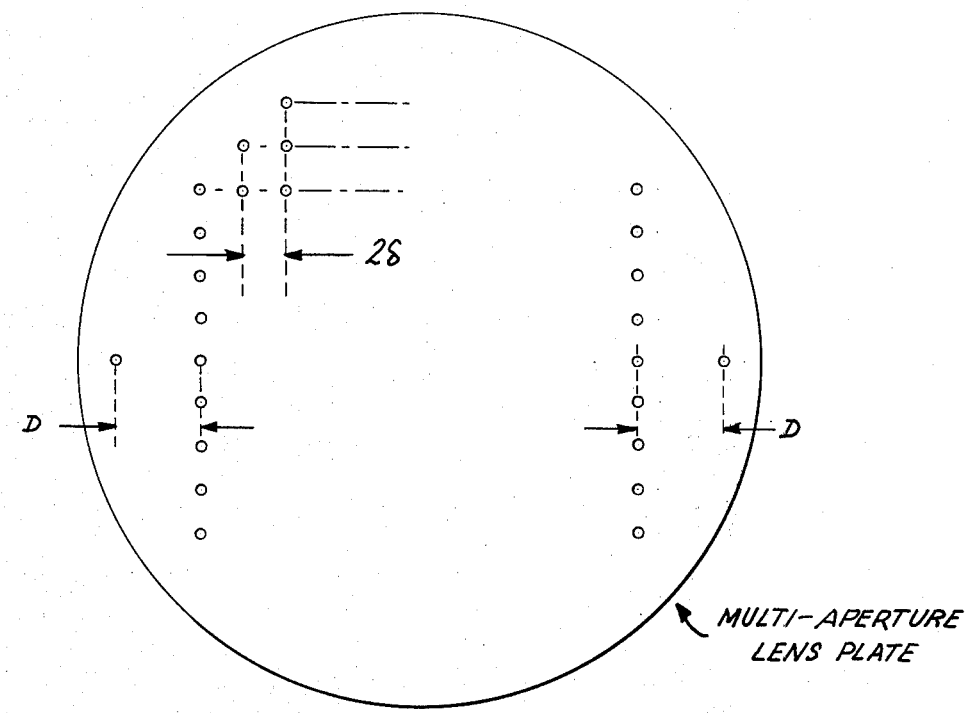
FIG. 1 is a top view of a typical lens plate, in accordance with the present invention.
Figure 2:
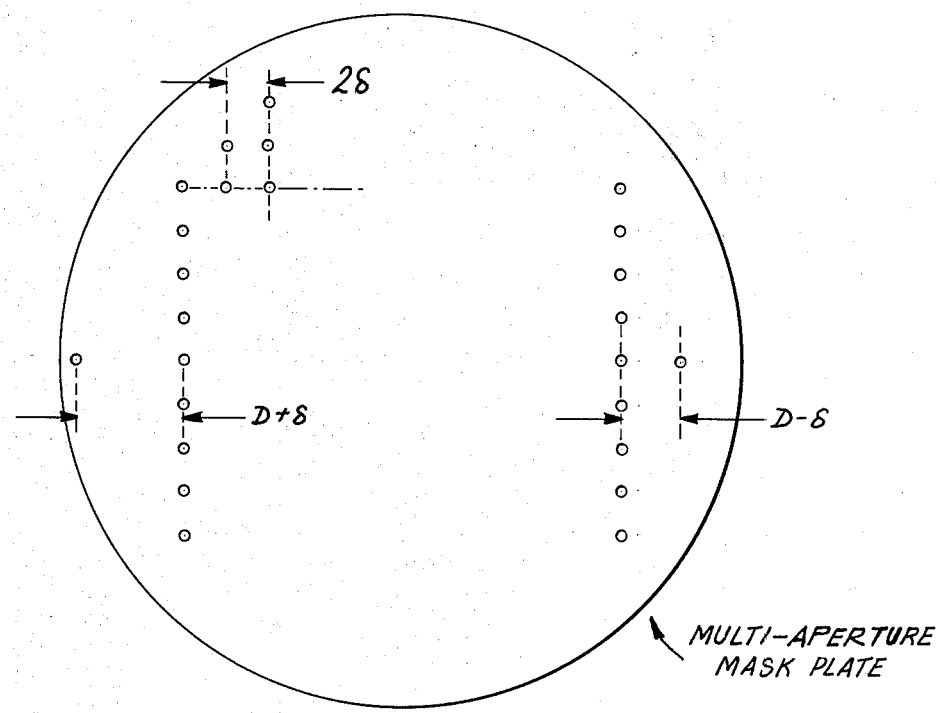
FIG. 2 is a top view of a typical mask plate, in accordance with the present invention.

Referring to FIGS. 1 and 2, a top view of a typical lens plate and mask (cover) plate, respectively, are illustrated. As shown in FIG. 1, a multi-aperture lens plate, which is approximately the same diameter as the substrate to be written upon, contains a regular array of lenslet apertures on a Cartesian coordinate system. The lens plate or screen lens array comprises a pair of plates which are mutually aligned with respect to one another. The upper lens plate consists of an array of apertures typically on the order of 0.05 to 0.075 cm. diameter, and the lower lens plate consists of an array of apertures, typically on the order of 0.15 cm. diameter. It is noted that, for certain applications, the individual lenslet apertures could be located in the form of a rectangular or other type of geometric pattern. Each lenslet aperture of the lens plate is separated from its nearest neighbor by a distance of 2$\delta$. Also illustrated are two (typically) additional apertures in the lens plate which may be used for reregistration or test pattern writing. These two latter apertures are spaced a distance D from the nearest column of lenslet apertures used to write the chip pattern.

Similarly, as shown in FIG. 2, a multi-aperture mask plate contains the same number of apertures as the lens plate. The apertures in the mask plate or lens cover plate are typically on the order of 0.05 to 0.075 diameter. The difference between the aperture array illustrated in FIG. 2 from that in FIG. 1 is that the spacings between the reregistration apertures and the nearest columns of writing apertures in the mask plate are $(D+\delta)$ and $(D-\delta)$ whereas in the lens plate the spacings are equidistant, D.

It should be apparent that if the mask plate is placed on top of the lens plate, useful alignments between the two occur when all of the chip-writing apertures are aligned, but the reregistration apertures are misaligned, and when the registration apertures are aligned, but the chip-writing apertures are misaligned. Thus, by imparting a linear motion to either the lens plate or mask (cover) plate the processes of chip-writing and registration may be independently and sequentially performed. It is noted, however, that if the lens were moved, much higher positional accuracy would be required to ensure good overlay. So for our application, it is far easier to slide the lens cover where overlay is determined by the (fixed) lens location, and lens cover positional accuracy is much less critical. Moreover, several sets of such misaligned apertures could be employed for multiple, sequential operations.

One technique for imparting such a linear motion to either the lens plate or the mask plate is to utilize a rotating cam having two or more stable positions and which may be actuated from outside of the vacuum system.

The lens plate and aperture plate illustrated in FIGS. 1 and 2 are maintained in a spaced-apart relationship typically on the order of 0.050 in by means of roller bearings and two metal support rings separated by an annular insulating ring to permit application of a bias potential to the lens cover as will be described. The thickness of both the lens plate and cover plate are typically 0.1 cm. Although the thermal load imparted by the beam causes the cover plate to expand and relocate the point of entry of each beamlet into each lenslet and focussed image produced by the lens plate on the substrate does not move since the lens plate does not expand, it being very substantially protected from any thermal beam load by the cover plate.

Figure 3:
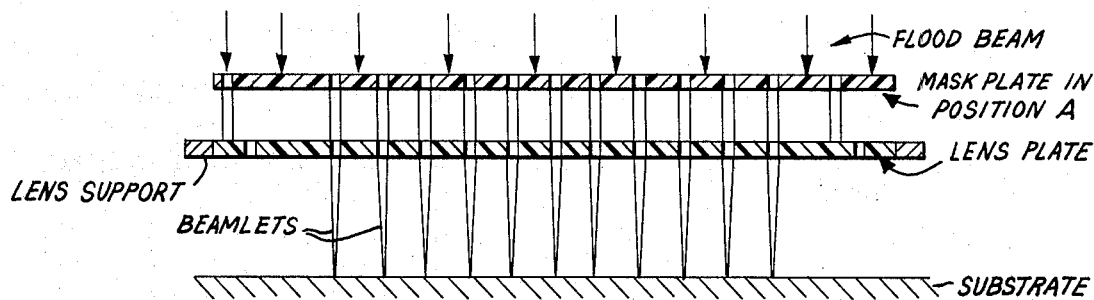
FIG. 3 illustrates one orientation of the lens plate and mask plate wherein the writing apertures therein are aligned.
Figure 4:
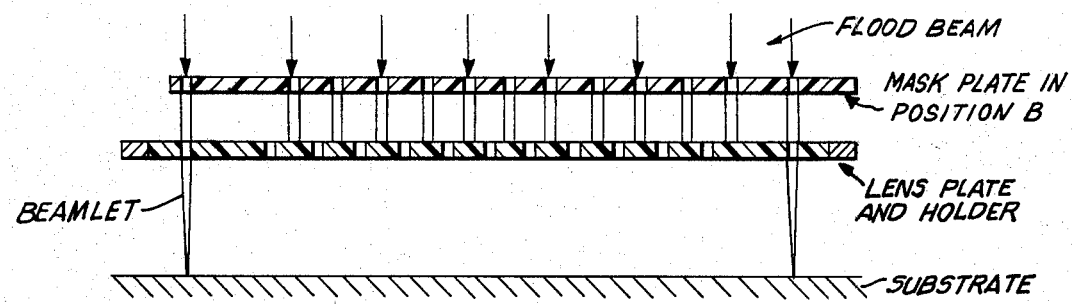
FIG. 4 illustrates another orientation of the lens plate and mask plate wherein the reregistration apertures are aligned.

As illustrated in FIGS. 3 and 4, two such juxtapositions of lens plate and mask plate to perform two such operations as described above are illustrated.

As shown in FIG. 3, the chip-writing apertures are normally aligned and the reregistration apertures are normally misaligned. As a result of imparting a relative motion of the lens and mask plates effecting a movement therebetween of distance, as shown in FIG. 4, the normally aligned chip-writing apertures become misaligned and the normally misaligned reregistration apertures become aligned.

Figure 5:
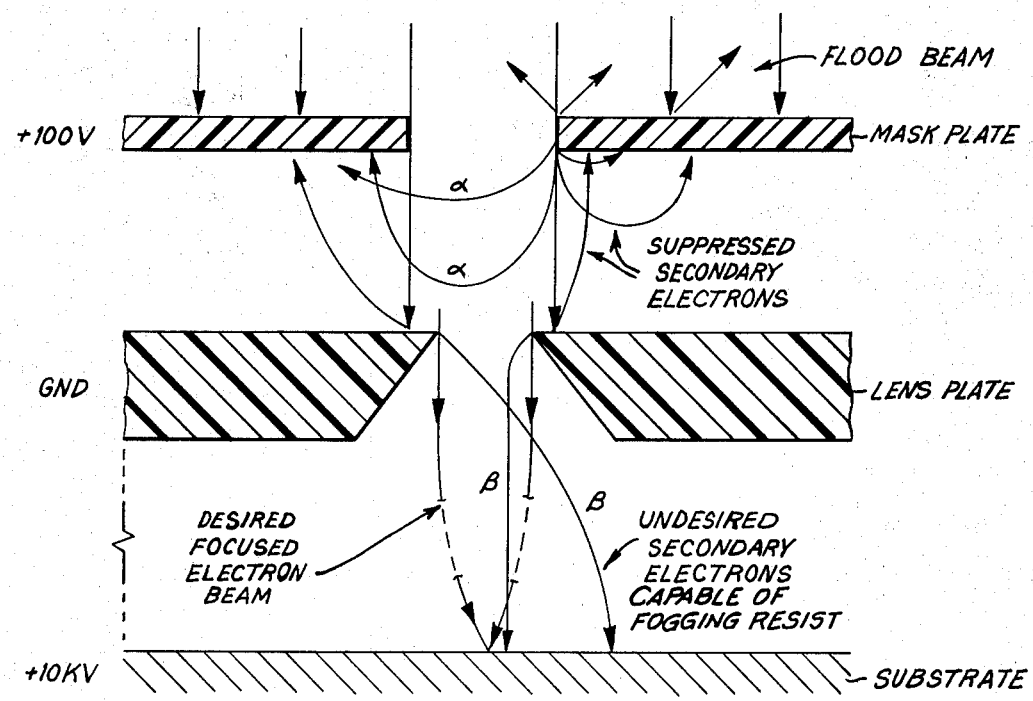
FIG. 5 illustrates how secondary electrons are suppressed by electrically biasing the mask plate.

Referring now to FIG. 5, a schematic cross-section of a single lens (beam focussing) aperture and aligned mask plate aperture permitting passage of the electron beam to the substrate is illustrated. Also shown therein are some illustrative electron trajectories produced by impact of the primary electron flood beam on the mask plate and lens plate. When such electrons arrive at the surface of the resist-coated substrate, the resist may become fogged and wipe out the desired pattern exposure of the resist. By applying a potential difference of typically 100 V. between the mask plate and lens plate, most of such secondary electrons may be suppressed and thus prevented from reaching the resist as shown.

Secondary electrons produced at the lens plate are more difficult to suppress; but can be greatly reduced by making the aperture diameters in the mask plate smaller than those in the lens plate. In the absence of an electrically biased mask plate, all such secondaries produced at the lens plate would reach the resist surface due to its attractive $+10$ kv. potential, and severe fogging would result.

It is clear that the above description of the preferred embodiment in no way limits the scope of the present invention which is defined by the following claims.

What is claimed is:

1. A screen lens array system comprising:
   a. a first plate having a first and second group of apertures therein;
   b. a second plate having a first and second group of apertures therein;
   c. said first plate and said second plate being maintained at different potentials in a predetermined spaced-apart relationship;
   d. wherein the first group of apertures in said first and second plates are normally aligned and the second group of apertures in said first and second plates are normally misaligned; and
   e. said first and second plates being capable of relative movement therebetween to cause said normally aligned apertures in said first and second plates to become misaligned and said normally misaligned apertures in said first and second plates to become aligned.

2. A screen lens array system as recited in claim 1 wherein said first group of apertures in said first plate are smaller than said first group of apertures in said second plate.

3. A screen lens array system as recited in claim 2 wherein each of said first groups of apertures is characterized by generally circular shapes.

4. A screen lens array system for use in a parallel charged particle beam exposure system comprising:
   a. a first plate having a first and second group of apertures therein;
   b. a second plate having a first and second group of apertures therein;
   c. said first plate and said second plate being maintained at different potentials in a predetermined spaced-apart relationship;

d. wherein the first group of apertures in said first and second plates are normally aligned and the second group of apertures in said first and second plates are normally misaligned; and e. said first and second plates being capable of relative movement therebetween to cause said normally aligned apertures in said first and second plates to become misaligned and said normally misaligned apertures in said first and second plates to become aligned.

5. A screen lens array system as recited in claim 4 wherein said first group of apertures in said first plate are smaller than said first group of apertures in said second plate.

6. A screen lens array system as recited in claim 5, wherein each of said first groups of apertures is characterized by generally circular shapes.

7. A screen lens array system for use in a parallel electron beam exposure system comprising:
   a. a first plate having a first and second group of apertures therein;
   b. a second plate having a first and second group of apertures therein;
   c. said first plate and said second plate being maintained at different potentials in a predetermined spaced-apart relationship;
   d. wherein the first group of apertures in said first and second plates are normally aligned and the second group of apertures in said first and second plates are normally misaligned; and
   e. said first and second plates being capable of relative movement therebetween to cause said normally aligned apertures in said first and second plates to become misaligned and said normally misaligned apertures in said first and second plates to become aligned.

8. A screen lens array system as recited in claim 7 wherein said first group of apertures in said first plate are smaller than said first group of apertures in said second plate.

9. A screen lens array system as recited in claim 8 wherein each of said first groups of apertures is characterized by generally circular shapes.

10. A screen lens array system as recited in claim 9 wherein said first group of apertures in said first plate are on the order of 0.05 to 0.075 cm. diameter, and said first group of apertures in said second plate are on the order of 0.15 cm. diameter.

11. A screen lens array system as recited in claim 9 wherein said potential difference between said first and second plates is on the order of 100 volts.

12. A screen lens array system as recited in claim 9 wherein said first plate has a thickness on the order of 0.5 mm.

13. A screen lens array system for use in a parallel electron beam exposure system for directly writing an integrated circuit pattern simultaneously at a plurality of locations on a target surface comprising:
   a. a mask plate including a group of writing apertures and a group of reregistration apertures therein;
   b. a lens plate including a group of writing apertures and a group of reregistration apertures therein;
   c. said mask plate and said lens plate being maintained at different potentials in a predetermined spaced-apart relationship;
   d. wherein the writing apertures in said mask and lens plates are normally aligned and the reregistration apertures in said mask and lens plates are normally misaligned; and
   e. said mask and lens plate being capable of relative movement therebetween to cause said normally aligned writing apertures in said mask and lens plates to become misaligned and said normally misaligned reregistration apertures in said mask and lens plates to become aligned.

14. A screen lens array system as recited in claim 13 wherein the writing apertures in said mask plate are smaller than the writing apertures in said lens plate.

15. A screen lens array system as recited in claim 14 wherein the writing apertures in each of said plates are characterized by generally circular shapes.

16. A screen lens array system as recited in claim 15 wherein the writing apertures in said mask plate are on the order of 0.05 to 0.075 cm. diameter, and the writing apertures in said lens plate are on the order of 0.15 cm. diameter.

17. A screen lens array system as recited in claim 15 wherein said potential difference between said mask plate and said lens plate is on the order of 100 volts.

18. A screen lens array system as recited in claim 15 wherein said mask plate has a thickness on the order of 0.55 mm.

19. A screen lens array system as recited in claim 15 wherein said lens plate has a thickness on the order of 0.55 mm.

* * * * *